(12) United States Patent
Feng et al.

(10) Patent No.: US 9,775,240 B2
(45) Date of Patent: *Sep. 26, 2017

(54) CARBON NANOTUBE COMPOSITE FILM

(71) Applicant: Beijing FUNATE Innovation Technology Co., LTD., Beijing (CN)

(72) Inventors: Chen Feng, Beijing (CN); Yu-Quan Wang, Beijing (CN); Li Qian, Beijing (CN)

(73) Assignee: Beijing FUNATE Innovation Technology Co., LTD., Beijing (CN)

( * ) Notice: Subject to any disclaimer, the term of this patent is extended or adjusted under 35 U.S.C. 154(b) by 405 days.

This patent is subject to a terminal disclaimer.

(21) Appl. No.: 13/865,804

(22) Filed: Apr. 18, 2013

(65) Prior Publication Data

US 2014/0069699 A1    Mar. 13, 2014

(30) Foreign Application Priority Data

Sep. 11, 2012    (CN) .......................... 2012 1 0333728

(51) Int. Cl.
| | |
|---|---|
| H05K 1/09 | (2006.01) |
| G06F 3/041 | (2006.01) |
| C08J 5/00 | (2006.01) |
| B82Y 99/00 | (2011.01) |
| C08K 3/04 | (2006.01) |
| B82Y 30/00 | (2011.01) |
| B82Y 40/00 | (2011.01) |

(52) U.S. Cl.
CPC ................ *H05K 1/09* (2013.01); *C08J 5/005* (2013.01); *G06F 3/041* (2013.01); *B82Y 30/00* (2013.01); *B82Y 40/00* (2013.01); *B82Y 99/00* (2013.01); *C08K 3/04* (2013.01)

(58) Field of Classification Search
CPC ..... B82Y 30/00; B82Y 40/00; C01B 2202/08; C01B 31/022; C01B 31/025; C08J 5/005; H01B 1/24; H05K 1/09; Y10S 428/30; Y10S 977/742; B32B 3/266; Y10T 428/30; C08K 3/04
USPC ....................................... 977/742; 428/299.1
See application file for complete search history.

(56) References Cited

U.S. PATENT DOCUMENTS

| | | | |
|---|---|---|---|
| 8,331,606 B2 | 12/2012 | Wang et al. | |
| 9,299,478 B2 * | 3/2016 | Feng ........................ | H01B 1/24 |
| 2008/0248235 A1 * | 10/2008 | Feng et al. ................... | 428/113 |
| 2009/0159198 A1 * | 6/2009 | Wang et al. .................. | 156/281 |
| 2009/0169819 A1 * | 7/2009 | Drzaic ................... | B82Y 30/00 |
| | | | 428/156 |

(Continued)

FOREIGN PATENT DOCUMENTS

| | | |
|---|---|---|
| CN | 101790490 | 7/2010 |
| CN | 103377755 | 10/2013 |

(Continued)

*Primary Examiner* — Camie Thompson
(74) *Attorney, Agent, or Firm* — Steven Reiss

(57) ABSTRACT

A carbon nanotube composite film includes a carbon nanotube film and a polymer material composited with the carbon nanotube film. The carbon nanotube film includes a number of carbon nanotube linear units spaced from each other and a number of carbon nanotube groups spaced from each other. The carbon nanotube groups are combined with the carbon nanotube linear units. The polymer material is coated on surfaces of the carbon nanotube linear units and the carbon nanotube groups.

14 Claims, 10 Drawing Sheets

(56) References Cited

U.S. PATENT DOCUMENTS

| | | | |
|---|---|---|---|
| 2009/0311489 A1 | 12/2009 | Sheehan et al. | |
| 2010/0104808 A1* | 4/2010 | Fan | B82Y 30/00 428/143 |
| 2010/0285300 A1 | 11/2010 | Wang et al. | |
| 2011/0036828 A1* | 2/2011 | Feng et al. | 219/529 |
| 2011/0135894 A1* | 6/2011 | Liu et al. | 428/206 |
| 2011/0253907 A1 | 10/2011 | Qian et al. | |
| 2013/0287998 A1 | 10/2013 | Feng et al. | |

FOREIGN PATENT DOCUMENTS

| | | |
|---|---|---|
| TW | 201040104 | 11/2010 |
| TW | 201106721 | 2/2011 |
| TW | 201137919 | 11/2011 |

\* cited by examiner

CARBON NANOTUBE COMPOSITE FILM

RELATED APPLICATIONS

This application claims all benefits accruing under 35 U.S.C. §119 from China Patent Application No. 201210333728.7, filed on Sep. 11, 2012 in the China Intellectual Property Office, the disclosure of which is incorporated herein by reference. This Application is related to commonly-assigned applications entitled, "CARBON NANOTUBE COMPOSITE FILM AND METHOD FOR MAKING THE SAME," Ser. No. 13/862,737, filed Apr. 15, 2013; "METHOD FOR MAKING CARBON NANOTUBE COMPOSITE FILM," Ser. No. 13/862,745, filed Apr. 15, 2013.

BACKGROUND

1. Technical Field

The present disclosure relates to a carbon nanotube composite film.

2. Discussion of Related Art

A transparent conductive film has characteristics of high electrical conductivity, low electrical resistance, and good light penetrability. The transparent conductive film is widely used in liquid crystal display, touch panel, electrochromic devices, and airplane windows.

The conventional methods for forming the transparent conductive film include a vacuum evaporation method and a magnetron sputtering method. The drawbacks of these methods include complicated equipment, high cost and being unsuitable for mass production. Furthermore, these methods require a high-temperature annealing process which will damage a substrate on which the transparent conductive film is formed. The substrate with a low melting point cannot be used for forming the film. Thus, the conventional methods have their limitations.

Carbon nanotubes have excellent electrical conductivity. A carbon nanotube film made of the carbon nanotubes, which is prepared by drawing a carbon nanotube array, has good electrical conductivity and a certain transparence. However, the carbon nanotube film is composed of a plurality of carbon nanotubes joined by van der Waals attractive force therebetween. Thus, the strength of the carbon nanotube film drawn from the carbon nanotube array is relatively low.

What is needed, therefore, is to provide a carbon nanotube composite film with high strength, to overcome the above shortages.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
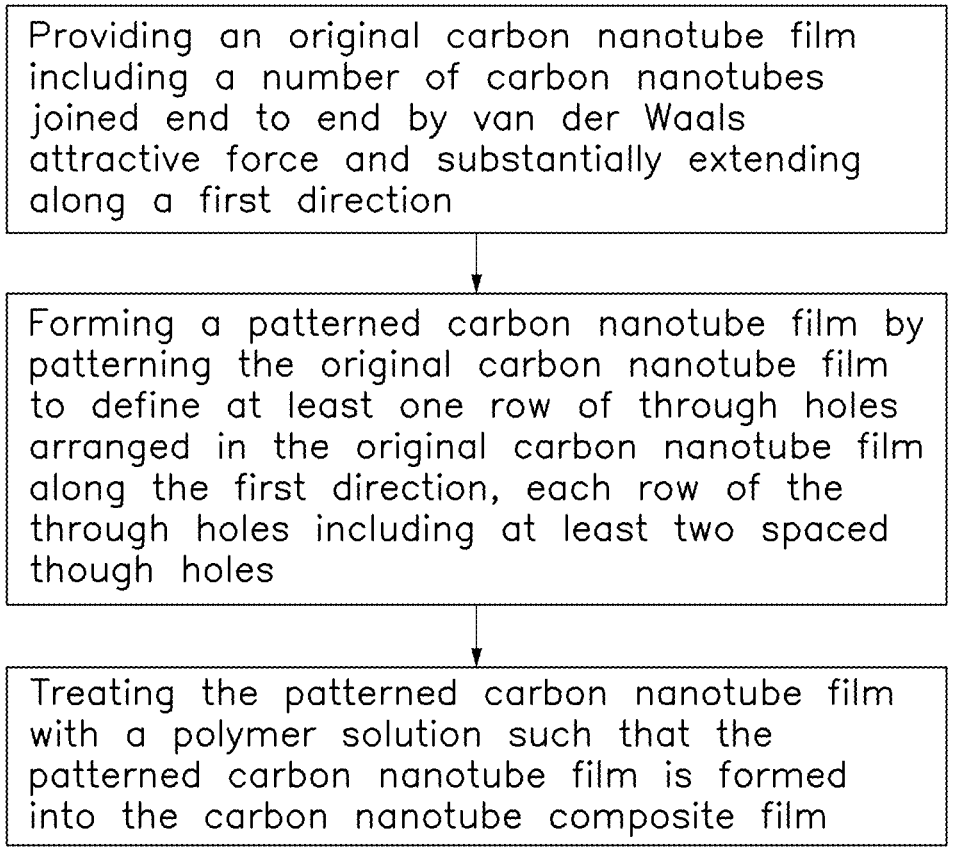
FIG. 1 is a flowchart of one embodiment of a method for making a carbon nanotube composite film.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

One embodiment of a carbon nanotube composite film 20 is provided. The carbon nanotube composite film 20 includes a treated patterned carbon nanotube film 22 and a polymer material 24 composited with the treated patterned carbon nanotube film 22. The treated patterned carbon nanotube film 22 includes a number of carbon nanotube linear units 222 and a number of carbon nanotube groups 224. The carbon nanotube linear units 222 and the carbon nanotube groups 224 are connected together and located in the same plane to cooperatively form the film shape of the treated patterned carbon nanotube film 22. The carbon nanotube linear units 222 are spaced from each other. The carbon nanotube groups 224 join with the carbon nanotube linear 222 units by van der Waals force. The carbon nanotube groups 224 located between adjacent carbon nanotube linear units 222 are separated from each other. The polymer material 24 is coated on surfaces of the carbon nanotube linear units 222 and the carbon nanotube groups 224.

The carbon nanotube linear units 222 substantially extend along a first direction, and are separated from each other along a second direction crossed with the first direction. A shape of a cross-section of each carbon nanotube linear unit 222 can be a semi-circle, circle, ellipse, oblate, or other shapes. In one embodiment, the carbon nanotube linear units 222 are substantially parallel to each other, and distances between adjacent carbon nanotube linear units 222 are substantially equal. The carbon nanotube linear units 222 are substantially coplanar. A diameter of each carbon nanotube linear unit 222 is larger than or equal to 0.1 micrometers, and less than or equal to 100 micrometers. In one embodiment, the diameter of each carbon nanotube linear unit 222 is larger than or equal to 5 micrometers, and less than or equal to 50 micrometers. Distances between adjacent carbon nanotube linear units 222 are not limited and can be selected as desired. In one embodiment, the distances between adjacent carbon nanotube linear units 222 are greater than 0.1 millimeters. Diameters of the carbon nanotube linear units 222 can be selected as desired. In one embodiment, the diameters of the carbon nanotube linear units 222 are substantially equal. Each carbon nanotube linear unit 222 includes a number of first carbon nanotubes substantially extending along the first direction. Adjacent first carbon nanotubes extending along the first direction are joined end to end by Van der Waals attractive force. In one embodiment, an axis of each carbon nanotube linear unit 222 is substantially parallel to the axis of first carbon nanotubes in each carbon nanotube linear unit.

The carbon nanotube groups 224 are separated from each other and combined with adjacent carbon nanotube linear 222 units by van der Waals force along the second direction. The treated patterned carbon nanotube film 22 can be a free-standing structure. The "free-standing structure" means that the treated patterned carbon nanotube film 22 can sustain its sheet-shaped structure without any supporter. In one embodiment, the carbon nanotube groups 224 arranged along the second direction are separated from each other by the carbon nanotube linear units 222. The carbon nanotube groups 224 arranged along the second direction also connect with the carbon nanotube linear units 222.

In one embodiment, the carbon nanotube groups 224 can be staggeredly located or disorderly arranged in the second direction. As such, the carbon nanotube groups 224 in the second direction form non-straight conductive paths in the treated patterned carbon nanotube film 22. In one embodiment, the carbon nanotube groups 224 are arranged into columns in the second direction, thus the carbon nanotube groups 224 form consecutive and straight conductive paths along the second direction in the treated patterned carbon nanotube film 22. In one embodiment, the carbon nanotube groups 224 in the treated patterned carbon nanotube film 22 are arranged in an array. A length of each carbon nanotube group 224 in the second direction is substantially equal to the distance between its adjacent carbon nanotube linear units 222, to connect the two carbon nanotube linear units 222 at the two sides of the carbon nanotube group 224. The length of each carbon nanotube group 224 on the second direction is greater than 0.1 millimeters. The carbon nanotube groups 224 are also spaced from each other along the first direction. Spaces between adjacent carbon nanotube groups 224 in the first direction are greater than or equal to 1 millimeter. The first direction can be substantially perpendicular to the second direction.

The carbon nanotube group 224 includes a number of second carbon nanotubes joined together by van der Waals force. Axes of the second carbon nanotubes can be substantially parallel to the first direction or the carbon nanotube linear units 222. The axes of the second carbon nanotubes can also be crossed with the first direction or the carbon nanotube linear units 222. The second carbon nanotubes in each carbon nanotube group 224 can be crossed with each other to form a network structure.

The treated patterned carbon nanotube film 22 includes a number of carbon nanotubes. The carbon nanotubes form the carbon nanotube linear units 222 and carbon nanotube groups 224. In one embodiment, the treated patterned carbon nanotube film 22 consists of the carbon nanotubes. The treated patterned carbon nanotube film 22 defines a number of apertures 26. Specifically, the apertures 26 are mainly defined by the separate carbon nanotube linear units 222 and the spaced carbon nanotube groups 224. The arrangement of the apertures 26 is similar to the arrangement of the carbon nanotube groups 224. In the treated patterned carbon nanotube film 22, if the carbon nanotube linear units 222 and the carbon nanotube groups 224 are orderly arranged, the apertures 26 are also orderly arranged. In one embodiment, the carbon nanotube linear units 222 and the carbon nanotube groups 224 are substantially arranged as an array, the apertures 26 are also arranged as an array. A ratio of an area sum of the carbon nanotube linear units 222 and the carbon nanotube groups 224 to an area of the apertures is less than or equal to 1:19. In other words, in treated patterned the carbon nanotube film 22, a ratio of the area having the carbon nanotubes to the area of the apertures 26 is less than or equal to 1:19. In one embodiment, in the treated patterned carbon nanotube film 22, the ratio of the total sum area of the carbon nanotube linear units 222 and the carbon nanotube groups 224 to the area of the apertures 26 is less than or equal to 1:49. Therefore, a transparency of the treated patterned carbon nanotube film 22 is greater than or equal to 95%. In one embodiment, the transparency of the treated patterned carbon nanotube film 22 is greater than or equal to 98%.

The treated patterned carbon nanotube film 22 is an anisotropic conductive film. The carbon nanotube linear units 222 form first conductive paths along the first direction in the treated patterned carbon nanotube film 22, as the carbon nanotube linear units 222 extend along the first direction. The carbon nanotube groups 224 form second conductive paths along the second direction in the treated patterned carbon nanotube film 22. Therefore, a resistance of the treated patterned carbon nanotube film 22 along the first direction is different from a resistance of the treated patterned carbon nanotube film 22 along the second direction. The resistance of the treated patterned carbon nanotube film 22 along the second direction is over 10 times greater than the resistance of the treated patterned carbon nanotube film 22 along the first direction. In one embodiment, the resistance of the treated patterned carbon nanotube film 22 along the second direction is over 20 times greater than the resistance of the treated patterned carbon nanotube film 22 along the first direction. In one embodiment, the resistance of the treated patterned carbon nanotube film 22 along the second direction is about 50 times greater than the resistance of the treated patterned carbon nanotube film 22 along the first direction. In the treated patterned carbon nanotube film 22, the carbon nanotube linear units 222 are joined by the carbon nanotube groups 224 on the second direction, which makes the treated patterned carbon nanotube film 22 strong and stable.

It is noted that there can be a few carbon nanotubes randomly surrounding the carbon nanotube linear units 222 and the carbon nanotube groups 224 in the treated patterned carbon nanotube film 22. However, these few carbon nanotubes have a small and negligible effect on the properties of the treated patterned carbon nanotube film 22.

The polymer material 24 is coated on the surfaces of the carbon nanotube linear units 222 and the carbon nanotube groups 224. The polymer material 24 can be uniformly and continuously distributed on the surfaces of every carbon nanotube linear unit 222, to form a plurality of carbon nanotube composite linear units. The shape of a cross-section of each carbon nanotube composite linear unit can also be a semi-circle, circle, ellipse, oblate, or other shapes, corresponding to the carbon nanotube linear unit in the core. The diameter of the carbon nanotube composite linear unit is determined by the diameter of the carbon nanotube linear unit 222 and the thickness of the polymer material 24 coating layer. The polymer material 24 can be uniformly and continuously distributed on the surfaces of every carbon nanotube group 224, to form a plurality of carbon nanotube composite groups. In the carbon nanotube composite film 20, the carbon nanotube composite linear units and the carbon nanotube composite groups cooperatively define a plurality of apertures 26. The size of the apertures 26 is determined by the original apertures 26 in the treated patterned carbon nanotube film 22 and the thickness of the polymer material 24 coating layer on the carbon nanotube linear units 222 and the carbon nanotube groups 224. In one embodiment, a ratio of an area having the carbon nanotube composite linear units and the carbon nanotube composite groups to an area of the apertures 26 is less than or equal to 1:9. A transparency of the carbon nanotube composite film 20 can be greater than or equal to 90%. In one embodiment, in the carbon nanotube composite film 20, the ratio of the area having the carbon nanotube composite linear units and the carbon nanotube composite groups to the area of the apertures 26 is less than or equal to 1:19. That is, a percentage of the total area of the apertures 26 in the total area of the carbon nanotube composite film 20 is larger than or equal to about 95%. A transparency of the carbon nanotube composite film 20 can be greater than or equal to 95%. The polymer material 24 can be filled into the inner space of the carbon nanotube linear units 222 and the carbon nanotube groups 224 to combine the carbon nanotubes. The polymer material 24 can be a thermosetting polymer or a thermoplastic polymer, such as epoxy resin, polyolefin resin, acrylic resin, polyamide, polyurethane (PU), polycarbonate (PC), polyacetal resin (POM), polyethylene terephthalate (PET), polymethyl methacrylate (PMMA), silicone resin, and any combination thereof.

Referring to FIG. 1, one embodiment of a method for making the carbon nanotube composite film 20 includes the following steps:

S10, providing an original carbon nanotube film 120 including a number of carbon nanotubes joined end to end by van der Waals attractive force and substantially extending along a first direction;

S20, forming a patterned carbon nanotube film 120' by patterning the original carbon nanotube film 120 to define at least one row of through holes arranged in the original carbon nanotube film 120 along the first direction, each row of the through holes including at least two spaced though holes 122; and S30, treating the patterned carbon nanotube film 120' with a polymer solution such that the patterned carbon nanotube film 120' is formed into the carbon nanotube composite film 20.

Figure 2:
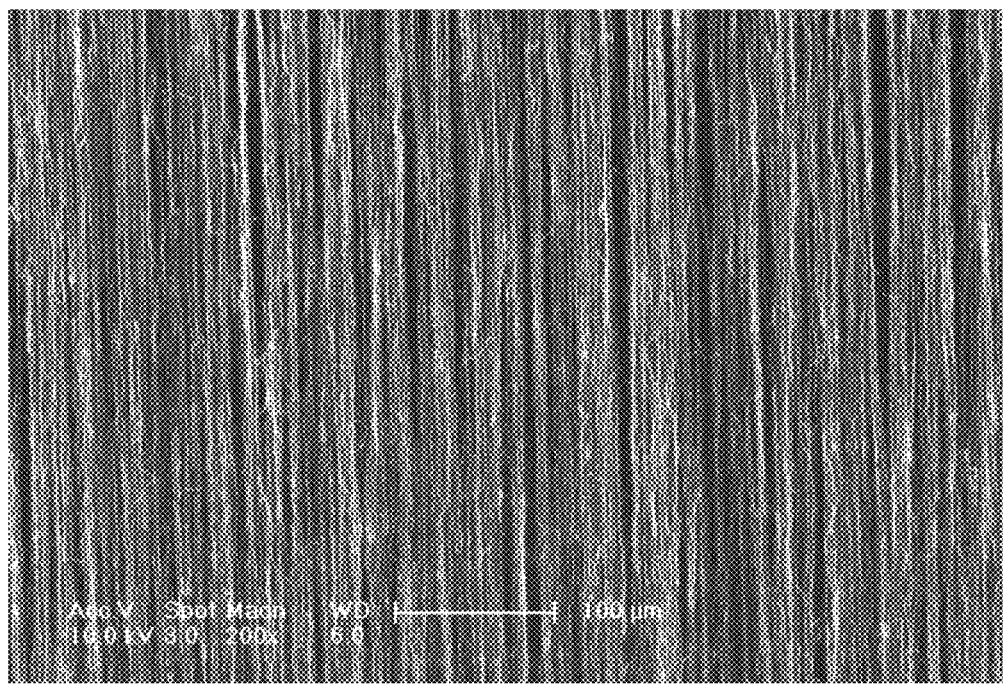
FIG. 2 is a scanning electron microscope (SEM) image of an original carbon nanotube film.

In step S10, the original carbon nanotube film 120 can be shown in FIG. 2. The original carbon nanotube film 120 can be obtained by drawing from a carbon nanotube array 110 substantially along the first direction. Specifically, the original carbon nanotube film 120 can be made by the steps of: providing the carbon nanotube array 110 including a number of substantially parallel carbon nanotubes; and selecting carbon nanotubes from the carbon nanotube array 110 and pulling the selected carbon nanotubes substantially along the first direction, thereby forming the original carbon nanotube film 120.

In one embodiment, the carbon nanotube array 110 is formed on a substrate 112, and the carbon nanotubes in the carbon nanotube array 110 are substantially perpendicular to the substrate. During the pulling process, as the initial carbon nanotubes are drawn out and separated from the substrate 112, other carbon nanotubes are also drawn out end to end due to van der Waals force between ends of adjacent carbon nanotubes. This process of pulling produces the original carbon nanotube film 120 with a certain width. The extending direction of the carbon nanotubes in the original carbon nanotube film 120 is substantially parallel to the pulling direction of the original carbon nanotube film 120. Therefore, the original carbon nanotube film 120 consists of carbon nanotubes, and the carbon nanotubes are combined by van der Waals force. The original carbon nanotube film 120 is a free-standing structure. The carbon nanotubes in the original carbon nanotube film 120 define a number of micropores, and effective diameters of the micropores are less than 100 nanometers.

The step S20 is mainly used to form spaced through holes 122 arranged along the first direction in the original carbon nanotube film 120. The original carbon nanotube film 120 can be patterned by using laser beams or electron beams irradiate the original carbon nanotube film 120.

In one embodiment, the original carbon nanotube film 120 is patterned by laser beams, and the step S20 includes the following sub-steps. A laser is provided. An irradiating path of a laser beam emitted from the laser can be controlled by a computer. A shape data of the original carbon nanotube film 120 having the though holes 122 are inputted into the computer, which controls the irradiating path of the laser beam. The laser irradiates the original carbon nanotube film 120 to form the through holes 122. A power density of the laser beam ranges from about 10000 watts per square meter to about 100000 watts per square meter and a moving speed of the laser beam ranges from about 800 millimeters per second (mm/s) to about 1500 mm/s. In one embodiment, the power density is in a range from about 70000 watts per square meter to about 80000 watts per square meter, and the moving speed is in a range from about 1000 mm/s to about 1200 mm/s.

In step S20, a shape of each through hole 122 can be a circle, ellipse, triangle, quadrangle, or other shapes. The quadrangle shape can have at least one pair of parallel sides, such as a parallelogram, trapezia, rectangle, square, or rhombus. In one embodiment, the shape of each through hole 122 is rectangular. In another embodiment, the shape of the through hole 122 is a straight line, which can be considered as a rectangle with a narrow width. A size of the through hole 122 and micropore represents the maximum distance between one point to another point both on the edge of the through hole 122 and micropore. An effective size of the through hole 122 is larger than the effective size of the micropore in the original carbon nanotube film 120. In one embodiment, the effective size of the through hole 122 is larger than or equal to 0.1 millimeters. A space between adjacent through holes 122 is larger than the effective size of the micropore in the original carbon nanotube film 120. In one embodiment, the space between adjacent through holes 122 is larger than or equal to 0.1 millimeters. The shape and effective size of the through hole 122 and the space between adjacent through holes 122 can be selected as desired. In one embodiment, the shape of the through hole 122 is square having edges larger than or equal to 0.1 millimeters, and the distance between the adjacent through holes 122 is larger than or equal to 0.1 millimeters.

Figure 3:
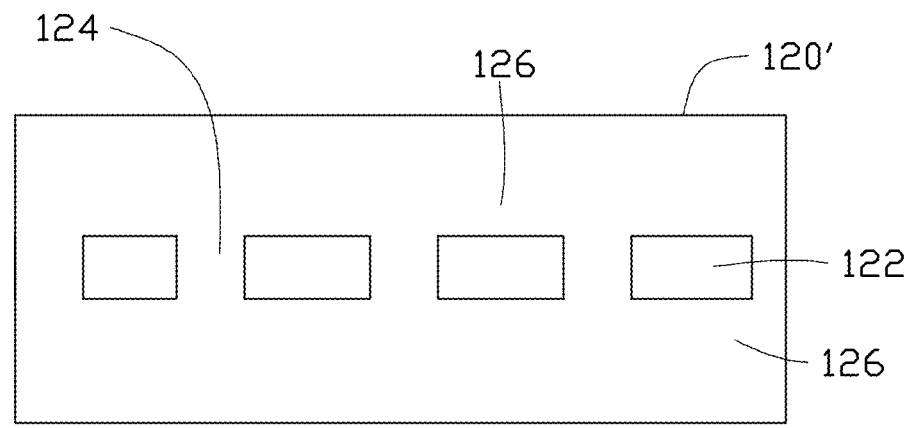
FIG. 3 is a schematic view of one embodiment of a patterned carbon nanotube film with through holes substantially arranged in a row.

In step S20, the patterned carbon nanotube film 120' can be divided into a number of connecting parts 124 and at least two extending parts 126 by the through holes 122. The connecting parts 124 are located between adjacent through holes 122 in each row. The connecting parts 124 are separated from each other along the first direction by the through holes 122. The at least two extending parts 126 substantially extend along the first direction. The at least two extending parts 126 are connected with each other on the second direction by the connecting parts 124. Therefore, the at least two extending parts 126 and the connecting parts 124 are an integrated structure. Specifically, structures of the patterned carbon nanotube films 120' can be described as follow:

(1) Referring to FIG. 3, a number of through holes 122 are separately formed in a patterned carbon nanotube film 120'. The through holes 122 are arranged into only one row along a first direction X. The first direction X is substantially parallel to the extending direction of the carbon nanotubes in the patterned carbon nanotube film 120'. The patterned carbon nanotube film 120' can be divided into a number of connecting parts 124 and two extending parts 126 by the through holes 122. The connecting parts 124 are parts of the patterned carbon nanotube film 120' between adjacent through holes 122 in the same row. The two extending parts 126 are parts of the patterned carbon nanotube film 120' except the connecting parts 124.

The connecting parts 124 are separated from each other by the though holes 122. The connecting parts 124 and the though holes 122 in the same row are alternately arranged. The two extending parts 126 are located on opposite sides of the connecting parts 124. The extending parts 126 are divided by the connecting parts 124 along a second direction Y crossed with the first direction X. In one embodiment, the second direction Y is substantially perpendicular to the first direction X. Each extending part 126 extends along the first direction X.

Figure 4:
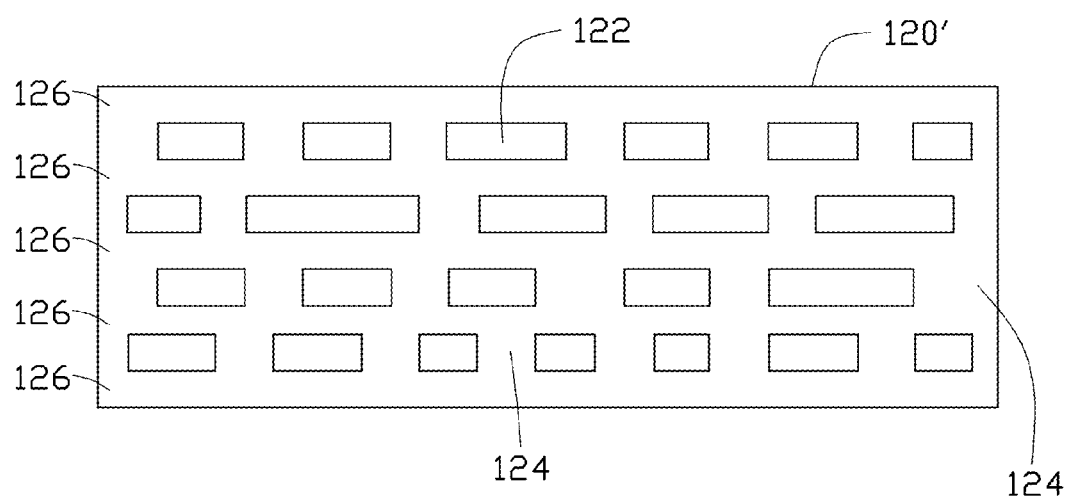
FIG. 4 is a schematic view of another embodiment of the patterned carbon nanotube film with through holes substantially arranged in a number of rows.

(2) Referring to FIG. 4, a number of through holes 122 are arranged into a number of rows in the patterned carbon nanotube film 120'. The through holes 122 in the same row are spaced from each other along the first direction X. The through holes 122 are staggered with each other along the second direction Y. That is, the through holes 122 in the second direction Y are not arranged in a straight line. It can be understood that the through holes 122 in the second direction Y can also be arranged in columns, and the through holes 122 in the same column are spaced from each other. The through holes 122 can be arranged as an array.

The patterned carbon nanotube film 120' is divided into a number of connecting parts 124 and a number of extending parts 126 by the through holes 122. Every adjacent connecting parts 124 in the same row are separated by the through hole 122. A length of each connecting part 124 is equal to a space between adjacent through holes 122 in the same row along the first direction X. Each extending part 126 is a connective structure along the first direction X. Each extending part 126 is sandwiched between adjacent connecting parts 124 in the second direction Y. A width of each extending part 126 in the second direction Y is equal to a space between adjacent through holes 122 in the second direction Y. The extending parts 126 connect with adjacent connecting parts 124 arranged along the second direction Y. In one embodiment, an effective length of each through hole 122 in the first direction X is larger than a space between adjacent through holes 122 along the second direction Y. The extending parts 126 and the connecting parts 124 are belonged to the integrated structure of the patterned carbon nanotube film 120'.

The shapes of the through holes 122 or the space between adjacent through holes arranged in the same row or in the same column can be different. In the patterned carbon nanotube film 120', the arrangement of the connecting parts 124 is similar to the arrangement of the through holes 122. There are a few carbon nanotubes protruding around edges of each through holes 122, which is a result of the manufacturing process of the carbon nanotube film 22.

In step S30, the patterned carbon nanotube film 120' is suspended. The step S30 can include:

dropping or spraying the polymer solution on the suspended patterned carbon nanotube film 120' to soak the patterned carbon nanotube film 120', thus forming the patterned carbon nanotube film 120' into the carbon nanotube film 22; and solidifying the polymer solution on the carbon nanotube film 22, thus achieving the carbon nanotube composite film 20.

The polymer solution is obtained by dissolving a polymer material or a monomer of the polymer material in a solvent. A concentration of the polymer solution is less than 10 wt %. In one embodiment, the concentration of the polymer solution is in a range from about 0.1 wt % to about 1 wt %. The higher the concentration of the polymer solution, the higher the viscosity of the polymer solution, and the difficult the processing of the method. The smaller the concentration of the polymer solution, the harder the compositing of the patterned carbon nanotube film 120' and the polymer material. The solvent can be water, ethanol, methanol, acetone, dichloroethane, chloroform, or combinations thereof. The solute of the polymer solution can be the thermosetting polymer, thermoplastic polymer, or the monomer thereof, that is capable of being dissolved in the solvent. In one embodiment, the polymer material is a transparent material.

In the step S3, the polymer solution is applied to the patterned carbon nanotube film 120'. The patterned carbon nanotube film 120' is formed into the carbon nanotube film 22, meanwhile the polymer material is composited with the carbon nanotube film 22. In a macroscopic view, the treated patterned carbon nanotube film 22 has a similar patterned film shape with the patterned carbon nanotube film 120'. In a microscopic view, the treated patterned carbon nanotube film 22 has the carbon nanotubes combined closer than that in the patterned carbon nanotube film 120'. Thus, the treated patterned carbon nanotube film 22 has a smaller surface area than the patterned carbon nanotube film 120'. Because the existence of the solvent in the polymer solution, the extending parts 126 in the patterned carbon nanotube film 120' are shrunk into the carbon nanotube linear units 222 of the treated patterned carbon nanotube film 22 under the interfacial tension of the solvent as it dissipates (e.g., volatilizes). During the treating process with the polymer solution, each extending part 126 of the patterned carbon nanotube film 120' is substantially shrunk toward its center in the second direction and formed into the carbon nanotube linear unit 222, a space between adjacent extending parts 126 will be increased. Therefore, the carbon nanotube linear units 222 are spaced from each other in the treated patterned carbon nanotube film 22. A space between adjacent carbon nanotube linear units 222 in the treated patterned carbon nanotube film 22 is larger than the effective size of the through holes 122 connected with the extending part 126 or larger than the effective size of the through holes 122 defined by the patterned carbon nanotube film 120' in the second direction (e.g., larger than 0.1 millimeters). Simultaneously, each connecting part 124 will be pulled along the second direction due to the shrinking of the adjacent extending parts 126. The orientation of the carbon nanotubes in the connecting part may be varied due to the pulling. The connecting part 124 is formed into the carbon nanotube group 224 in the treated patterned carbon nanotube film 22. Therefore, the treated patterned carbon nanotube film 22 is formed.

The polymer solution can be solidified by removing the solvent therein. The monomer of the polymer material can be further polymerized to in-situ form the polymer material 24 on the treated patterned carbon nanotube film 22. The polymer material 24 can be coated on the surface of the treated patterned carbon nanotube film 22 and infiltrated into the micropores between the carbon nanotubes in the carbon nanotube linear units 222 and the carbon nanotube groups 224 of the treated patterned carbon nanotube film 22, to composite with the treated patterned carbon nanotube film 22. The thickness of the polymer material coating layer can be controlled by adjusting the concentration of the polymer solution.

An interfacial tension is generated between the patterned carbon nanotube film 120' and the solvent in the polymer solution, and the interfacial tension varies depending on the volatility of the solvent. Pulling forces applied to the connecting parts 124 are produced by the shrinking of the extending parts 126. The pulling forces vary depending on the interfacial tension. Different solvent may have different pulling forces to the carbon nanotubes in the patterned carbon nanotube film 120'. The pulling forces can affect the arrangement of the carbon nanotubes in the connecting parts 124, and further affect the structures of the carbon nanotube groups 224 in the treated patterned carbon nanotube film 22. Different solvent may result different arrangement of the carbon nanotubes in the carbon nanotube groups 224.

If the solvent is an organic solvent with a high volatility, such as alcohol, methanol, acetone, dichloroethane, or chloroform, the interfacial tension generated between the patterned carbon nanotube film 120' and the solvent is strong. During the process of shrinking the extending parts, pulling forces are produced. The pulling forces applied to the connecting parts 124 adjacent to the extending parts 126 are strong. The carbon nanotubes oriented along the first direction in the connecting parts 124 will be formed into the second carbon nanotubes extending along a direction crossing with the first direction. Simultaneously, under the interfacial tension, the carbon nanotubes in each connecting part 124 will be shrunk and each connecting part 124 will be formed into the carbon nanotube group 224 with a net structure. In one embodiment, a first angle defined by the second carbon nanotubes and the first direction is greater than or equal to 45 degrees, and less than or equal to 90 degrees.

If the solvent is water, or a mixture of water and the organic solvent, the interfacial force between the patterned carbon nanotube film 120' and the solvent is relatively weak. The pulling forces generated by the shrinking of the extending parts 126 are weak, thus the pulling forces are weakly applied to the connecting parts 124. The arrangements of the carbon nanotubes in the connecting parts 124 will be a little changed by the weak pulling forces. A second angle is defined by the second carbon nanotubes in the carbon nanotube groups 224 with the first direction. The second angle is less than or equal to 30 degrees. In one embodiment, the second angle is less than or equal to 15 degrees. In one embodiment, the first solvent is water, and during the process of forming the carbon nanotube linear units 222, the arrangements of carbon nanotubes in the connecting parts 124 are substantially not changed. Therefore, the second carbon nanotubes in the carbon nanotube groups 224 are substantially parallel to the carbon nanotube linear units 222 and the first direction.

In the step S20, if the through holes 122 are arranged in rows, the carbon nanotube linear units 222 made from the extending parts 126 of the original carbon nanotube film 120, will be substantially parallel to each other. If the through holes 122 are arranged in rows and columns, the extending parts 126 will be formed into carbon nanotube linear units 222 substantially extending along the first direction, and the carbon nanotube linear units 222 are separately arranged on the second direction. At the same time, the connecting parts 124 will be formed into the carbon nanotube groups 224, and the carbon nanotube groups 224 will connect with the carbon nanotube linear units 222 on the second direction and be spaced in the first direction. The carbon nanotube linear units 222, which are substantially parallel and separate on the second direction, form the first conductive paths substantially extending along the first direction. The carbon nanotube groups 224 are connected with the carbon nanotube linear units 222 in the second directions and spaced in the first direction, which form the second conductive paths extending along the second direction.

Therefore, the diameters of the carbon nanotube linear units 222 can be selected by the spaces between adjacent through holes 122 in the second direction and the shapes of the through holes 122. Spaces between adjacent carbon nanotube linear units 222 can be controlled by the spaces between adjacent through holes 122 in the second direction and the widths of through holes 122 in the second direction. In one embodiment, the shape of the through holes 122 is rectangular, the widths of the through holes in the second direction are equal, and the spaces between adjacent though holes 122 in the same rows are equal. Therefore, the shapes and the diameters of the carbon nanotube linear units 222 are respectively equal. Further, if the lengths of the through holes 122 in the first directions are equal, the carbon nanotube groups 224 will be substantially arranged in the second direction and the shapes of the carbon nanotube groups 224 will be substantially the same. In conclusion, both the spaces between adjacent carbon nanotube linear units 222 and the diameter of the carbon nanotube linear units 222 can be effectively and easily adjusted according to the method for making the treated patterned carbon nanotube film 22 provided by the present disclosure.

Under the same condition, a resistance of the treated patterned carbon nanotube film 22 along the first direction is not affected by the number of the through holes 122 arranged along the first direction. The more through holes 122 that are arranged along the first direction, the higher a resistance of the treated patterned carbon nanotube film 22 along the second direction. The less through holes 122 that are arranged along the first direction, the lower the resistance of the treated patterned carbon nanotube film 22 along the second direction. Under the same condition, the resistance of the treated patterned carbon nanotube film 22 along the second direction is not affected by the number of the through holes 122 in the patterned carbon nanotube film 120' along the second direction. The more through holes 122 that are arranged along the second direction, the higher a resistance of the treated patterned carbon nanotube film 22 along the first direction. The less through holes 122 that are arranged along the second direction, the lower the resistance of the treated patterned carbon nanotube film 22 along the first direction. Therefore, the resistance of the treated patterned carbon nanotube film 22, especially the electrical anisotropy of the treated patterned carbon nanotube film 22, can be changed by the number of the through holes 122 in the patterned carbon nanotube film 120'. That is, the step S20 can affect the resistance of the treated patterned carbon nanotube film 22.

It is noted that, the electrical conductivity of the treated patterned carbon nanotube film 22 can be affected by parameters of the through holes 122. If the through holes 122 are uniformly distributed in the patterned carbon nanotube film 120' and each through hole 122 is rectangular, the length of each through hole 122 in the first direction is marked as parameter A, the width of each through hole 122 in the second direction is marked as parameter B, the space between adjacent through holes 122 in the first direction is marked as parameter C, and the space between adjacent through holes 122 in the second direction is marked as parameter D. In one embodiment, the parameter A is smaller than the parameter D. If compared with the parameter A, the parameter B is relatively small, the through holes 122 can be considered as straight lines. The affect of the parameters of the through holes 122 on the resistance and electrical anisotropy of the treated patterned carbon nanotube film 22 can be detailed below:

(1) If the parameters A and B are constant, the ratio of the resistance of the treated patterned carbon nanotube film 22 along the second direction to the resistance of the treated patterned carbon nanotube film 22 along the first direction is increased as the ratio of the parameter A to parameter B (A/B) increases. The electrical anisotropy of the treated patterned carbon nanotube film 22 is proportional to the ratio of the parameter A to parameter B.

(2) If the parameters A and C are constant, the resistance of the treated patterned carbon nanotube film 22 at the first direction is increased as the ratio of the parameter B to parameter D (B/D) increases.

(3) If the parameters B and D are constant, the resistance of the treated patterned carbon nanotube film 22 along the second direction is increased as the ratio of the parameter A to parameter C (A/C) increases. In addition, the electrical anisotropy of the treated patterned carbon nanotube film 22 can be improved by decreasing the ratio of the parameter A to the parameter C.

The method for making the carbon nanotube composite film 20 further includes a step of collecting the carbon nanotube composite film 20. Specifically, one end of the original carbon nanotube film 120 drawn from the carbon nanotube array 110 is fixed on a collecting unit. The collecting unit is rolled, the original carbon nanotube film 120 can be continuously patterned and treated with the polymer solution in order, and then the carbon nanotube composite film 20 is continuously formed and rolled up on the collecting unit. Thus, the carbon nanotube composite film 20 can be continuously formed as the rolling of the collecting unit. The carbon nanotube composite film 20 can be produced automatically. It can be understood that the collecting unit also can be a fixing element 128 used to fix the original carbon nanotube film 120, such as a bar.

The carbon nanotube composite films 20 and the methods for making the carbon nanotube composite films 20 can be further described in the following embodiments.

Figure 5:
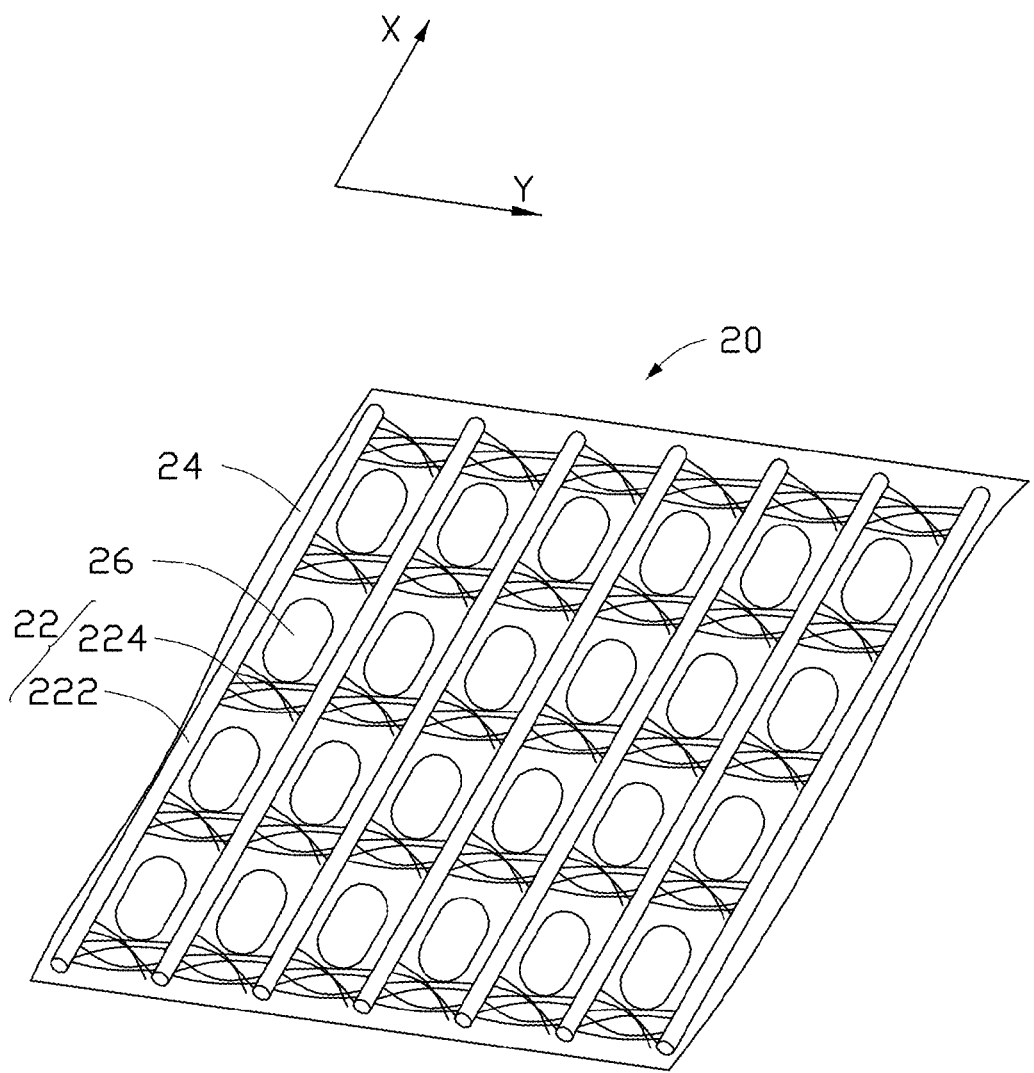
FIG. 5 is a schematic view of one embodiment of a carbon nanotube composite film.

Referring to FIG. 5, one embodiment of carbon nanotube composite film 20 is provided. The carbon nanotube composite film 20 includes a treated patterned carbon nanotube film 22 and a polymer material 24 composited with the treated patterned carbon nanotube film 22. The treated patterned carbon nanotube film 22 is a free-standing structure, and includes a number of carbon nanotube linear units 222 and a number of carbon nanotube groups 224. The carbon nanotube groups 224 are connected between the adjacent two carbon nanotube linear units 222 by van der Waals force. The carbon nanotube linear units 222 are inserted among the carbon nanotube groups 224.

The carbon nanotube linear units 222 are substantially parallel to each other and separate from each other along the second direction Y. The carbon nanotube linear units 222 extend along the first direction X which is substantially perpendicular to the second direction Y, to form the first conductive paths. The first direction X can be substantially perpendicular to the second direction Y. Each carbon nanotube linear unit 222 consists of carbon nanotubes joined end-to-end by van der Waals force and substantially extend along the first direction X. The diameter of the carbon nanotube linear unit 222 is about 10 micrometers. The space between adjacent two carbon nanotube linear units 222 is wider than 1 millimeter.

The plurality of carbon nanotube groups 224 are arranged in an array. Specifically, the carbon nanotube groups 224 are spaced from each other along the first direction X. The carbon nanotube groups 224 are orderly arranged in columns along the second direction Y and connected with the carbon nanotube linear units 222 to form the second conductive paths. Each carbon nanotube group 224 includes the carbon nanotubes intersected with each other to form a network structure. The extending directions of the carbon nanotubes in the carbon nanotube groups 224 are not parallel to the first direction X. Angles defined between the extending directions of the carbon nanotubes in the carbon nanotube groups 224 and the first direction X are greater than or equal to 60 degrees, and less than or equal to 90 degrees.

It is noted that there can be a few carbon nanotubes randomly surrounding the carbon nanotube linear units 222 and the carbon nanotube groups 224 in the carbon nanotube film 22. However, these few carbon nanotubes have a small and negligible effect on the properties of the carbon nanotube film 22.

The polymer material 24 is coated on the surfaces of the carbon nanotube linear units 222 and the carbon nanotube groups 224. The polymer material can be uniformly and continuously distributed on the surfaces of every carbon nanotube linear unit 222 and infiltrated into the inner space of the carbon nanotube linear units 222, to form a plurality of carbon nanotube composite linear units. The polymer material can be uniformly and continuously distributed on the surface of every carbon nanotube group 224 and infiltrated into the inner space of the carbon nanotube groups 224, to form a plurality of carbon nanotube composite groups. In the carbon nanotube composite film 20, the carbon nanotube composite linear units and the carbon nanotube composite groups cooperatively defines a plurality of apertures 26.

The carbon nanotube composite film 20 has different structures in the first direction X and the second direction Y. Therefore, the carbon nanotube composite film 20 has different properties in the first and second direction X, Y. The carbon nanotube composite film 20 is an electrically anisotropic film. The resistance of the carbon nanotube composite film 20 in the second direction Y can be about 50 times greater than that in the first direction X. The carbon nanotube composite film 20 can have a relatively high transparency in the visible light region.

Figure 6:
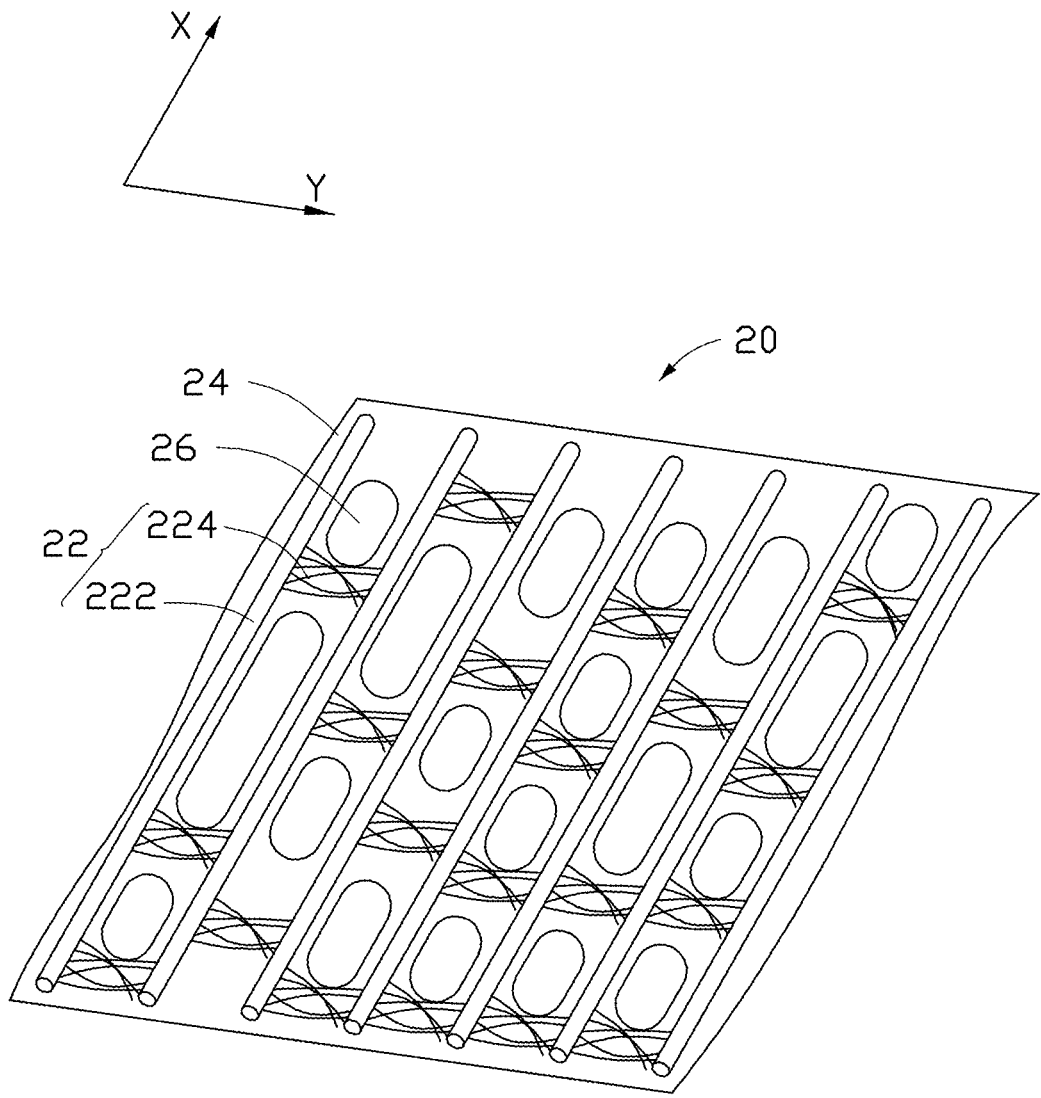
FIG. 6 is a schematic view of another embodiment of a carbon nanotube composite film.

It can be understood that the carbon nanotube composite film 20 can also have a structure as shown in FIG. 6, in which the carbon nanotube groups 224 are in a staggered arrangement in the second direction Y. Specifically, the carbon nanotube groups 224 are arranged in rows in the first direction X, and disorderly arranged in the second direction Y. In another embodiment, the carbon nanotube groups 224 are in a staggered arrangement in the first direction X. That is, the carbon nanotube groups 224 are arranged in columns in the second direction Y, and disorderly arranged in the first direction X.

In some embodiments, the sizes of the carbon nanotube groups 224 do not need to be the same. The sizes of the carbon nanotube linear units 222 also do not need to be the same. The carbon nanotube composite film 20 can have different sizes of the apertures 26.

Figure 7:
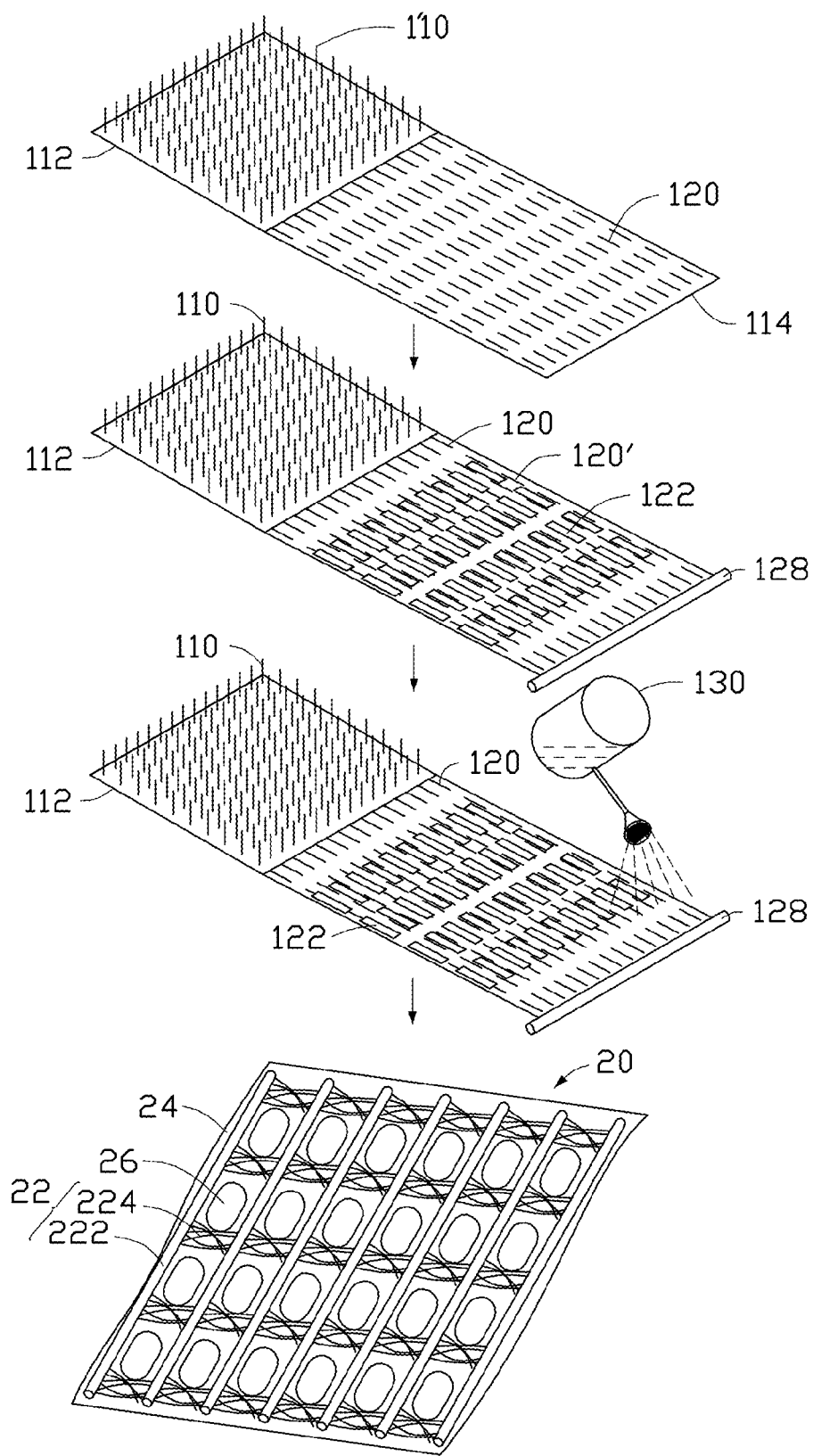
FIG. 7 is a schematic view of one embodiment of a method for making a carbon nanotube composite film.

Referring to FIG. 7, one embodiment of the method for making the carbon nanotube composite film 20 is provided. The method includes the following steps.

A carbon nanotube array 110 is provided. The carbon nanotube array 10 is grown on a growing substrate 112. An original carbon nanotube film 120 is drawn from the carbon nanotube array 110 using an adhesive tape 114. The original carbon nanotube film 120 includes a number of carbon nanotubes joined end to end by van der Waals force and substantially extending along the first direction X.

Figure 8:
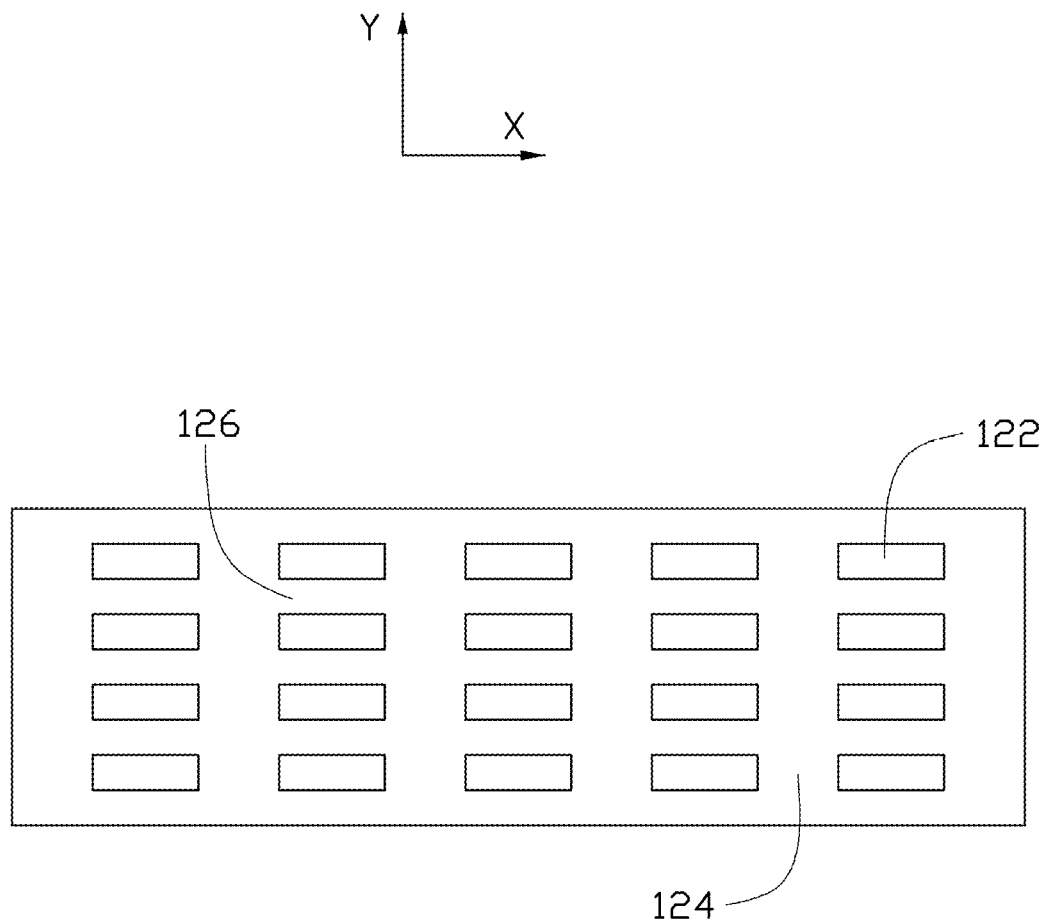
FIG. 8 is a schematic view of yet another embodiment of the patterned carbon nanotube film including through holes used in the method of FIG. 7.
Figure 9:
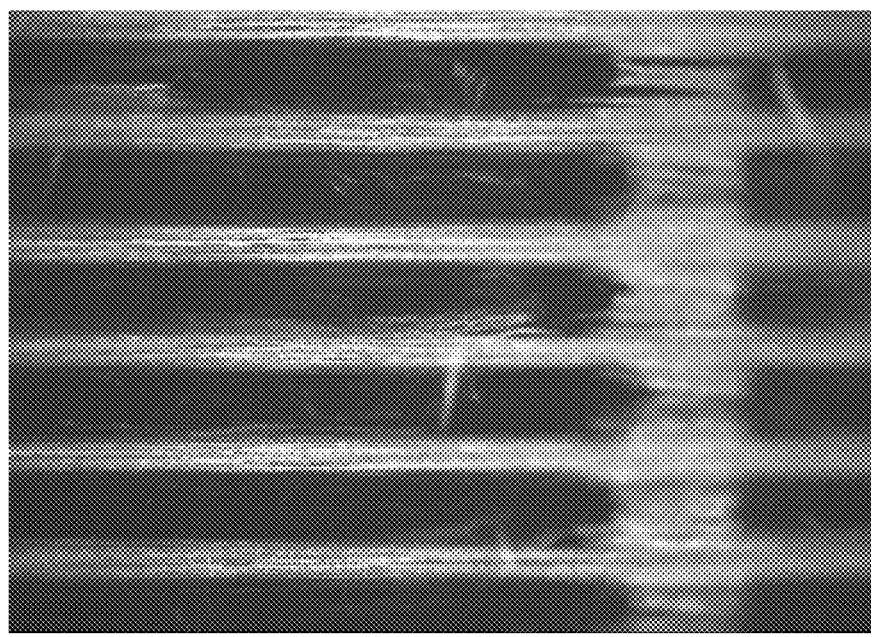
FIG. 9 is an optical microscope image of the patterned carbon nanotube film including through holes of FIG. 8.

The adhesive tape 114 is removed. The end of the original carbon nanotube film 120 adhered to the adhesive tape 114, is fixed on a fixing element 128. The fixing element 128 can be a bar. The original carbon nanotube film 120 between the fixing element 128 and the carbon nanotube array 110 is suspended. The suspended original carbon nanotube film 120 is patterned by a laser with a power density of about 70000 watts per square millimeter, and a scanning speed of about 1100 millimeters per seconds. A number of rectangular through holes 122 are defined in the original carbon nanotube film 120. The through holes 122 are uniformly arranged in rows and columns. Referring to FIGS. 8 and 9, the patterned carbon nanotube film 120 is divided into a number of connecting parts 124 and a number of extending parts 126 by the through holes 122. The connecting parts 124 are arranged in an array, which is similar to the arrangement of the through holes 122. The spaces between adjacent through holes 122 both in the first direction X and the second direction Y are about 1 millimeter. The length of the through hole 122 in the first direction X is about 3 millimeters. The width of the through hole 122 in the second direction Y is about 1 millimeter. That is, the parameters A, B, C and D of each through hole 122 are respectively about 3 millimeters, 1 millimeter, 1 millimeter, and 1 millimeter. Thus, the lengths of the connecting part 124 in the first direction X and the second direction Y are about 1 millimeter. The width of the extending part 126 in the second direction Y is equal to the parameter D of the through hole 122.

A drop bottle 130 is placed above the patterned carbon nanotube film 120. An alcohol solution of polyvinyl alcohol is dropped onto the patterned carbon nanotube film 120 from the drop bottle 130. Under interfacial tension produced between the extending part 126 and the alcohol, each extending part 126 is shrunk toward its center to form the carbon nanotube linear unit 222. The size of the through holes 122 is increased in the width direction, and thus, the through holes 122 are formed into the apertures 26. Simultaneously, a pulling force is produced in the process of the shrinking of the extending part 126. Under the pulling force and the interfacial tension produced between the connecting part 124 and the alcohol, extending directions of most of the carbon nanotubes in the connecting part 124 are shifted into directions intersecting with the first direction, and the carbon nanotube group 224 is formed. The carbon nanotube groups 224 are connected with the carbon nanotube linear units 222 in the second direction, and separated from each other in the first direction. Thus, the carbon nanotube composite film 20 is formed.

There are some carbon nanotubes protruding from the edges of the through holes 122 resulting from limitations of the laser. After the process of treatment with the solution, there can still be a few carbon nanotubes extending from the peripheries of the carbon nanotube linear units 222 and the carbon nanotube groups 224.

If the through holes are arranged in the staggered, disordered arrangement in the second direction Y as shown in FIG. 4, the carbon nanotube composite film 20 shown in FIG. 6 obtained by the above-mentioned method, includes the staggered carbon nanotube groups 224.

Figure 10:
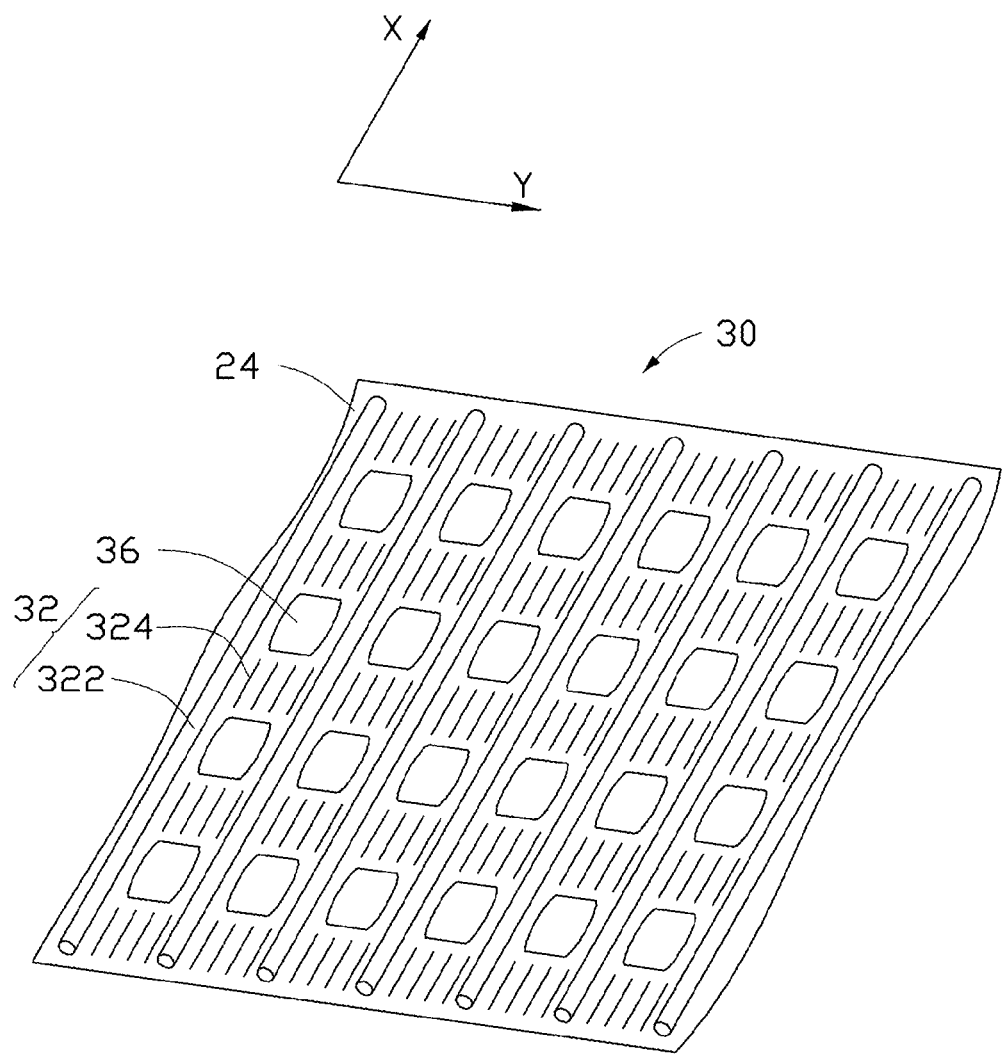
FIG. 10 is a schematic view of another embodiment of the carbon nanotube composite film.

Referring to FIG. 10, another embodiment of a carbon nanotube composite film 30 is provided. The carbon nanotube composite film 30 includes a carbon nanotube film 32 and a polymer material 24 composited with the carbon nanotube film 32. The carbon nanotube film 32 is a free-standing structure and includes a number of the carbon nanotube linear units 322 and a number of carbon nanotube groups 324 arranged in an array. The carbon nanotube group 324 is connected between two adjacent carbon nanotube linear units 322 by van der Waals attractive force. The structure of the carbon nanotube composite film 30 is similar to that of the carbon nanotube composite film 20, except that the carbon nanotube groups 324 includes a number of carbon nanotubes substantially extending along the first direction X. The carbon nanotube linear units 322 extend along the first direction X. That is, the carbon nanotubes in the carbon nanotube composite film 30 are substantially oriented along the same direction, which is the same as the extending direction of the carbon nanotube linear units 322.

A method for making the carbon nanotube composite film 30 is similar to the method for making the carbon nanotube composite film 20, except that in the step S30, a water solution of polyvinyl alcohol is used as the solution to treat the patterned carbon nanotube film 120' having a number of through holes 122 formed by laser.

The carbon nanotube composite film of the present disclosure has improved mechanical properties, such as a good strength. The plurality of apertures in the carbon nanotube composite film can increase the transparency of the carbon nanotube composite film. The carbon nanotube composite film is a free-standing structure and has a widely use, such as in a touch panel and a heater.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A carbon nanotube composite film, comprising:
   a treated patterned carbon nanotube film comprising:
      a plurality of carbon nanotube linear units spaced from each other, a distance between adjacent carbon nanotube linear units is larger than 0.1 millimeters, each of the plurality of carbon nanotube linear units comprises a plurality of carbon nanotubes joined end-to-end by van der Waals force and substantially oriented along an axis direction of the each carbon nanotube linear unit, a diameter of each carbon nanotube linear unit is greater than or equal to 5 micrometers, and less than or equal to 50 micrometers, and a shape of a cross-section of each carbon nanotube linear unit is a semi-circle, circle, ellipse, or oblate; and
      a plurality of carbon nanotube groups spaced from each other and combined with the plurality of carbon nanotube linear units; and
   a polymer material coated on surfaces of the plurality of carbon nanotube linear units and the plurality of carbon nanotube groups.

2. The carbon nanotube composite film of claim 1, wherein the plurality of carbon nanotube linear units are substantially parallel to each other and are aligned along a first direction to form a plurality of first conductive paths.

3. The carbon nanotube composite film of claim 2, wherein the plurality of carbon nanotube groups are spaced from each other in the first direction and are combined with the plurality of carbon nanotube linear units in a second direction intersected with the first direction to form a plurality of second conductive paths, the plurality of first conductive paths intersect with the plurality of second conductive paths.

4. The carbon nanotube composite film of claim 3, wherein the plurality of carbon nanotube groups are arranged in a staggered manner in the second direction.

5. The carbon nanotube composite film of claim 3, wherein the plurality of carbon nanotube groups are arranged in columns in the second direction.

6. The carbon nanotube composite film of claim 1, wherein each carbon nanotube group comprises a plurality of carbon nanotubes substantially extending along an axis direction of the each carbon nanotube linear unit.

7. The carbon nanotube composite film of claim 1, wherein each carbon nanotube group comprises a plurality of carbon nanotubes intersected with an axis direction of the each carbon nanotube linear unit.

8. The carbon nanotube composite film of claim 1, wherein a distance between adjacent carbon nanotube groups located between same two adjacent carbon nanotube linear units is larger than 1 millimeter.

9. The carbon nanotube composite film of claim 1, wherein the plurality of carbon nanotube groups are combined with the plurality of carbon nanotube linear units by van der Waals attractive force.

10. The carbon nanotube composite film of claim 1, wherein the plurality of carbon nanotube linear units and the plurality of carbon nanotube linear units define a plurality of micropores by carbon nanotubes, the polymer material is infiltrated into the plurality of micropores.

11. The carbon nanotube composite film of claim 1 defining a plurality of apertures, and a percentage of a total area of the plurality of apertures in a total area of the carbon nanotube composite film is greater than or equal to about 95%.

12. A carbon nanotube composite film comprising:
a plurality of carbon nanotube composite linear units spaced from each other; and
a plurality of carbon nanotube composite groups spaced from each other and combined with the plurality of carbon nanotube composite linear units;
wherein each of the plurality of carbon nanotube composite linear units comprises a carbon nanotube linear unit and a first polymer material composited with the carbon nanotube linear unit, and each of the plurality of carbon nanotube composite groups comprises a carbon nanotube group and a second polymer material composited with the carbon nanotube group, wherein the first polymer material is the same as the second polymer material, the plurality of carbon nanotube composite linear units and the plurality of carbon nanotube composite groups cooperatively defines a plurality of apertures, the plurality of carbon nanotube linear units and the plurality of carbon nanotube linear units define a plurality of micropores by carbon nanotubes, the polymer material is infiltrated into the plurality of micropores, a diameter of each carbon nanotube linear unit is greater than or equal to 5 micrometers, and less than or equal to 50 micrometers.

13. The carbon nanotube composite film of claim 12, wherein the first polymer material is coated on a surface of each of the plurality of carbon nanotube composite linear units and the second polymer material is coated on a surface of each of the plurality of carbon nanotube composite groups.

14. The carbon nanotube composite film of claim 12, wherein a ratio of a total area of the plurality of carbon nanotube composite linear units and the plurality of carbon nanotube composite groups to a total area of the plurality of apertures is less than or equal to 1:9.

* * * * *